(12) United States Patent
Kurshan et al.

(10) Patent No.: US 6,209,120 B1
(45) Date of Patent: Mar. 27, 2001

(54) VERIFYING HARDWARE IN ITS SOFTWARE CONTEXT AND VICE-VERSA

(75) Inventors: Robert Paul Kurshan, New York, NY (US); Vladimir Levin, New Providence, NJ (US); Marius Minea, Pittsburgh, PA (US); Doron A. Peled, Springfield, NJ (US); Husnu Yenigun, Kucukesat Ankara (TR)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/172,484

(22) Filed: Oct. 14, 1998

Related U.S. Application Data
(60) Provisional application No. 60/064,080, filed on Nov. 3, 1997.

(51) Int. Cl.[7] .................................................. G06F 17/50
(52) U.S. Cl. ............................................................ 716/5
(58) Field of Search ........................... 716/7, 18; 703/15

(56) References Cited
U.S. PATENT DOCUMENTS 5,537,580 * 7/1996 Giomi ..................................... 716/7

6,044,211 * 3/2000 Jain ....................................... 716/18

* cited by examiner

Primary Examiner—Matthew Smith
Assistant Examiner—Thuan Do
(74) Attorney, Agent, or Firm—Henry T. Brendzel

(57) ABSTRACT

A method and apparatus that employs static partial order reduction and symbolic verification allow the design of a system that includes both hardware and software to be verified. The system is specified in a hardware-centric language and a software-centric language, as appropriate, and properties are verified one at a time. Each property is identified whether it is hardware-centric or software-centric. A hardware-centric property that contains little software is does not employ the static partial order reduction. Software-centric properties, and hardware-centric properties that have substantial amounts of software do employ the static partial order reduction. Following partial order reduction, the software-centric language specifications are converted to synchronous form and combined with the hardware-centric specifications. The combined specification is applied to a symbolic verification tool, such as COSPAN, and the results are displayed.

27 Claims, 4 Drawing Sheets

VERIFYING HARDWARE IN ITS SOFTWARE CONTEXT AND VICE-VERSA

REFERENCE TO RELATED APPLICATIONS

This application claims the benefit of U.S. Provisional Application No. 60/064,080, filed Nov. 3, 1997. This application is also related to a second application, titled "Static Partial Order Reduction," filed by the inventors herein on even date herewith.

BACKGROUND

This invention relates to hardware and software design verification.

One facet of hardware/software co-design is dealing with verification at the hardware/software interface. In the typical case where the hardware and software are designed separately, a common problem is that the expectations of each design group do not match the implementation of the other. This is particularly true in situations where the hardware and the software interact extensively, with each part controlling the behavior of the other. When such interfaces are not properly handled, logical failures are likely to result, with attendant costly delays in production. The familiar presumption that the hardware and the software each can be designed successfully with only a sketchy understanding of the other side is unwarranted in complex systems. Each design team needs a precise description of its "environment" as defined by the other design. If formal models of the hardware design and the software design are used in support of this need, the problem of interface mismatch is moved to a problem of how to develop a design in the context of a formal environment description.

Conceptually, formal verification could offer a solution to this problem. However, direct application of model-checking in this context is mostly infeasible, because each side individually is often near the limit of feasible verification. Moreover, there is an intrinsic difficulty in applying finite-state verification to software, which often is viewed as an infinite-state system on account of its dependence on memory.

While hardware/software co-design has been treated extensively in terms of methodology, no viable methods have been published on formal co-verification. The co-verification problem is treated mainly as a testing problem, and a number of commercial tools have appeared for testing software in the context of hardware, and vice versa.

Apart from the above, partial order reduction and symbolic state space search have been applied widely to cope with the intrinsic computational complexity of modelchecking. Typically, these techniques are applied separately—only one or the other—since they appear to be incompatible. Partial order reduction algorithms found in the literature are based intrinsically on explicit state enumeration in the context of a depth-first search. The partial order reduction found in the prior art is derived dynamically in the course of enumerating the states. Symbolic verification deals only with sets of states defined by respective Boolean functions. State reachability is expressed in terms of the convergence of a monotone state set operator which implements a breadth-first search of the state space.

What makes partial order reduction problematic in this context has to do with guaranteeing that certain transitions which may be deferred in the course of the state space search (thus giving rise to the desired reduction), are not deferred indefinitely (resulting in an incomplete search). The usual way this is implemented in the context of explicit-state enumeration, is to explore all such deferred transitions in the course of closing any cycle during a depth-fist search.

Nonetheless, there is no intrinsic reason that partial order reduction and symbolic verification cannot be combined. Perhaps the first published proposal for such a combination is presented by R. Alur, R. K. Brayton, T. A. Henzinger, S. Qadeer, and S. K. Rajarnani, in "Partial order reduction in symbolic state space exploration," *Conference on Computer Aided Verification* (CAV 97), LNCS 1254, Springer-Verlag, (1997) pp 340–351. In that paper, the cycle-closing condition is replaced by some additional steps in the course of the symbolic breadth-first search, and those additional steps require the normal modelchecking algorithm to be altered.

SUMMARY

The obstacles of hardware/software co-verification are overcome with a method that employs partial order reduction and symbolic verification without requiring the existing model checking algorithms to be altered. Specifically, the hardware is specified in a hardware-centric language, the software is specified in a software-centric language, and the two specifications are applied to a single design verification tool that is adapted to operate with both languages. Functionally, the co-design is verified by identifying properties that are to be verified, and by verifying each of the properties individually. In verifying each property, only those components are considered in the hardware and software parts of the system that influence the behavior of the property. In the verification process, static partial order reduction is employed to identify the software states that need to be considered, which allows disregarding other software states. The static partial order reduction disclosed is completely isolated from the model-checking algorithm and it therefore does not depend on a specific search technique.

In order to have the partial order reduction of the asynchronous software model be compatible with the synchronous hardware model, the asynchronous model is transformed to an equivalent synchronous model and the partial order reduction is implemented in terms of constraints defined by automata. These automata are defined at compile time. The synchronous transformation uses non-determinism to simulate asynchrony and the constraints remove transitions which are redundant with respect to the partial order reduction. Thus, an implicit form of the entire partial order reduction is created statically by the compiler, without any need to modify the verification tool.

Illustratively, the software model employs the SDL language. The hardware is expressed in a synthesizable subset of VHDL or Verilog. The two models coordinate through interfaces, each of which looks like an SDL process to the software side, and an HDL module to the hardware side. Both the software and hardware models are then applied to a verification tool. Illustratively, the verification tool COSPAN is employed, and both the software and hardware models are pre-compiled into SIR, which is the input language of COSPAN. The reduced model is checked by COSPAN in the same manner as any synchronous model.

DETAILED DESCRIPTION

Figure 1:
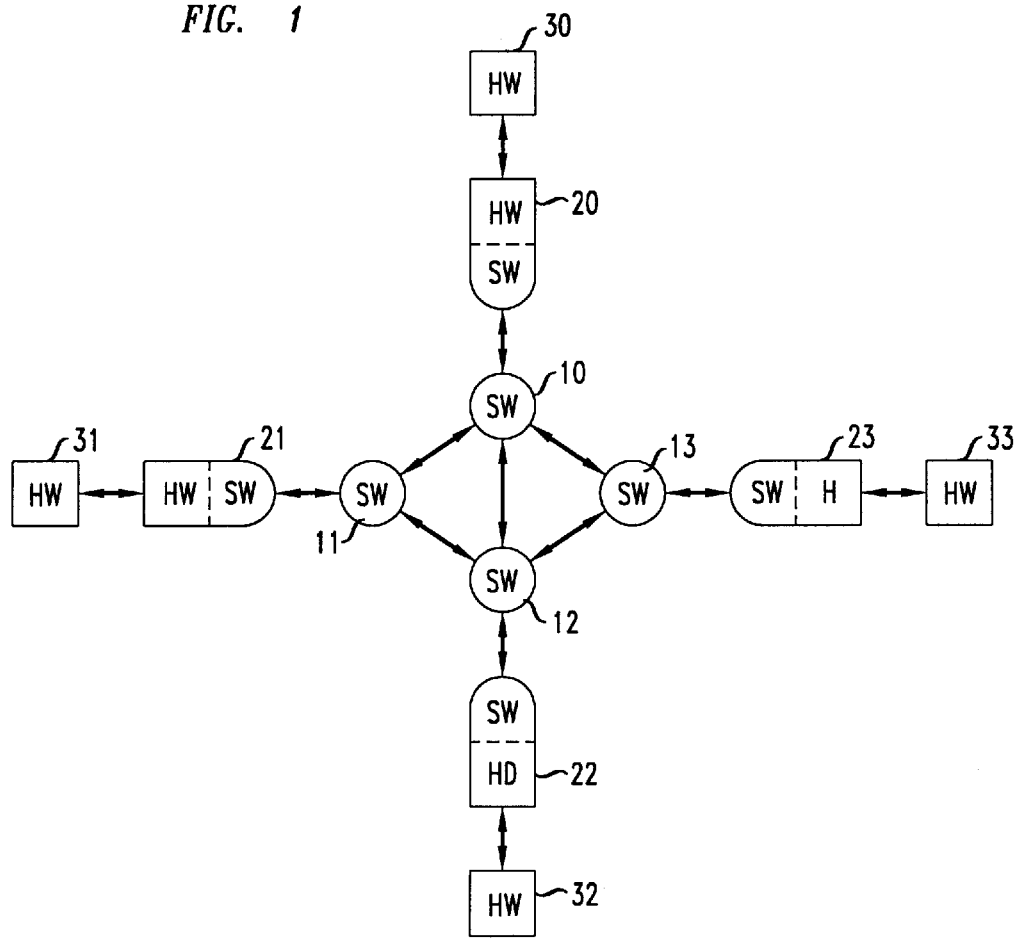
FIG. 1 presents a software-centric view of a system having both software and hardware parts.

One could envision a design methodology which starts from an abstract behavioral design model. This model may not distinguish hardware from software. If it does, it need not be reflected syntactically and need not be evident architecturally either, appearing perhaps only as an annotation. Such a unified abstract behavioral model could be formally verified and then formally refined (in a verifiable manner) to separate hardware and software components. The verification of the refinement would guarantee that the properties verified in the abstract design model are inherited by the coordinated behavior of the hardware and software implementation models, relieving the need to further check these properties in the refinement.

An advantage of such an approach would be that functional verification which today is conducted at the synthesizable level, could be instead conducted at an abstract behavioral level, where the design model is simpler. This would not only aid the verification process, but also simplify and accelerate the functional debugging itself, as there are fewer constructs that need to be altered to fix a design error. At this earlier stage of design development, the verification can be used to support architectural design evolution by spotting logical weaknesses in a preliminary architecture. Moreover, supporting debugging at an earlier stage in the design cycle is a well-known accelerant of the entire design development. In contrast, conventional design methodologies normally support testing and functional debugging only at a much later stage, once the synthesisable model is complete. Thus, the successive refinements design development methodology both accelerates the design process and produces more reliable designs.

At least for the present, however, since hardware and software are viewed at different levels of abstraction and embrace conceptually different aspects of a design, it is not unnatural to represent them with different languages tailored to their respective applications. Thus, one could express the hardware in a hardware-centric formal language and, similarly, express the software in a software-centric formal language, and apply the two system definitions to a verification tool that is adapted to accept both languages. The need, however, is to employ appropriate languages, and the desire is to employ any one of the existing verification tools without the need for modifications.

The choice of a hardware description language is strongly dictated by current use; i.e., its advantageous to use VHDL or Verilog. While these languages are closer in their use to low-level programming languages than to formal description techniques, the strong semantics which adhere to them from synthesis, as well as the perceived support for more structural constructs, make them suitable formal description languages.

Unlike with hardware, there is no widely accepted formal description language for software. As the size of the software projects makes their management increasingly difficult, the value of using formal languages and formal verification in the software development has been better understood. Some companies have designed their own formal languages and tools, and other languages have been promoted by international standardization. The Specification and Description Language (SDL), a standard language of ITU-T (formerly CCITT), is one of the most promising of these languages. It is regularly updated by ITU-T and has already found some applications in software projects. Hence, a first commercial embodiment of this invention is likely to employ the SDL language as it is currently defined, but it should be understood that neither the use of VHDL or Verilog, nor the use of SDL are dictated, or required, for a successful embodiment of arrangements that comport with the principles disclosed herein.

Once the hardware/software design has been verified, an SDL description of a system serves as a formal documentation that is used in the development phase of the software, and the VHDL can be used to synthesize the hardware. With the support of formal verification, a refinement may be checked against an abstract SDL model, and then synthesized automatically with the aid of C code that is generated by some verification tool, such as COSPAN, described by H. Hardin, Z. Har'El, and R. P. Kurshan, "COSPAN," *Conference on Computer Aided Verification* (CAV 96), LNCS 1102, Springer-Verlag, (1996) pp. 423–427.). COSPAN is licensable by Lucent Technologies, and equipment that employs COSPAN can be licensed from Cadence Design Systems, Inc.

Employing SDL has the additional advantage that a compiler exists for translating from SDL to S/R, the latter being the native language of COSPAN. This compiler can also be licensed from Lucent Technologies. A translator from VHDL to S/R is available as part of a tool called FormalCheck™, from Cadance Design Systems, Inc.

The interface between hardware and software is also described in SDL, but with a slight modification in semantics, described by V. Levin, E. Bounimova, O. Basbugoglu and K. Inan, in "A Verifiable Software/Hardware Codesign Using SDL and COSPAN," *Proceedings of the COST 247 Inter-national Workshop on Applied Formal Methods In System Design*, Maribor, Slovenia, 1998, pp. 6–16. In essence, it allows an interface process to read and write (combinatorial) signals from the hardware part. The coordination of an interface process with software processes and with other interface processes is handled completely by the SDL communication mechanism, namely the signal exchange through buffers. Therefore, an interface process looks like another software process from the view point of the software part. An interface process interacts with the hardware using shared variables called interface variables in the synchronous fashion of the hardware. Therefore, it appears like another hardware module to the hardware part of the system. The hardware, software and the interface parts of a co-design system are translated into S/R. This enables the entire co-design system, which has different parts with different natures, to be treated as a single synchronous system.

We distinguish between two types of global transitions in a co-design system. The transition of a single SDL process is called a software transition. The other kind of global transition is a hardware transition. Since hardware has a synchronous nature, a hardware transition corresponds to simultaneous transitions of all the hardware modules in a synchronous hardware component. An interface process can have both kinds of transitions. A transition of an interface process in which an interface variable is referenced counts as a hardware transition. Otherwise, it counts as a software transition. Since different abstraction levels can be used for hardware and software, we do not make an assumption about the relative speeds of the software and hardware.

As indicated above, one could express the hardware in a hardware-centric formal language and, similarly, express the software in a software-centric formal language, and apply the two system definitions to a verification tool that is adapted to accept both languages. However, that may not be enough when dealing will substantial designs. Conventional verification of purely hardware or purely software systems already faces great problems in dealing with complexity. In order to be able to deal with the far greater complexity when both a hardware and a software system are considered together, an additional novel approach is taken. Specifically, the software/hardware system to be verified is expressed in terms of properties that need to be verified, and each of the properties to be verified is identified as being software-centric (referring mainly to the software part of the system) or hardware-centric (referring mainly to the hardware part of the system). The verification of the property then proceeds in accordance with such identification.

FIG. 1 depicts a software-centric view of a system. In this view, software modules 10–13 are processes that communicate with one another and each of the processes has some interactions with an associated hardware element or subsystem. Those interactions are carried out through software/hardware interfaces. Thus, in FIG. 1, software process 10 is shown to interface with hardware element 30 through software/hardware interface 20, software process 11 is shown to interface with hardware element 31 through software/hardware interface 21, software process 12 is shown to interface with hardware element 32 through software/hardware interface 22, and software process 13 is shown to interface with hardware element 32 through software/hardware interface 23. The software system represented by the circles form a pure SDL system, with all processes coordinating asynchronously. The interface processes together with the hardware components form an environment for this SDL system. Therefore, the concept of environment becomes a structured world which enforces constraints on the behavior of the SDL system. Since the aim of the software-centric approach is to verify software properties, the hardware part typically can be reduced automatically to a high level of abstraction through localization reduction as described by R. P. Kurshan in "Computer-Aided Verification of Coordinating Processes: The Automata-Theoretic Approach," *Princeton Univ. Press*, which is hereby incorporated by reference The role of the hardware part is to adequately constrain the software part, in support of its verification.

Figure 2:
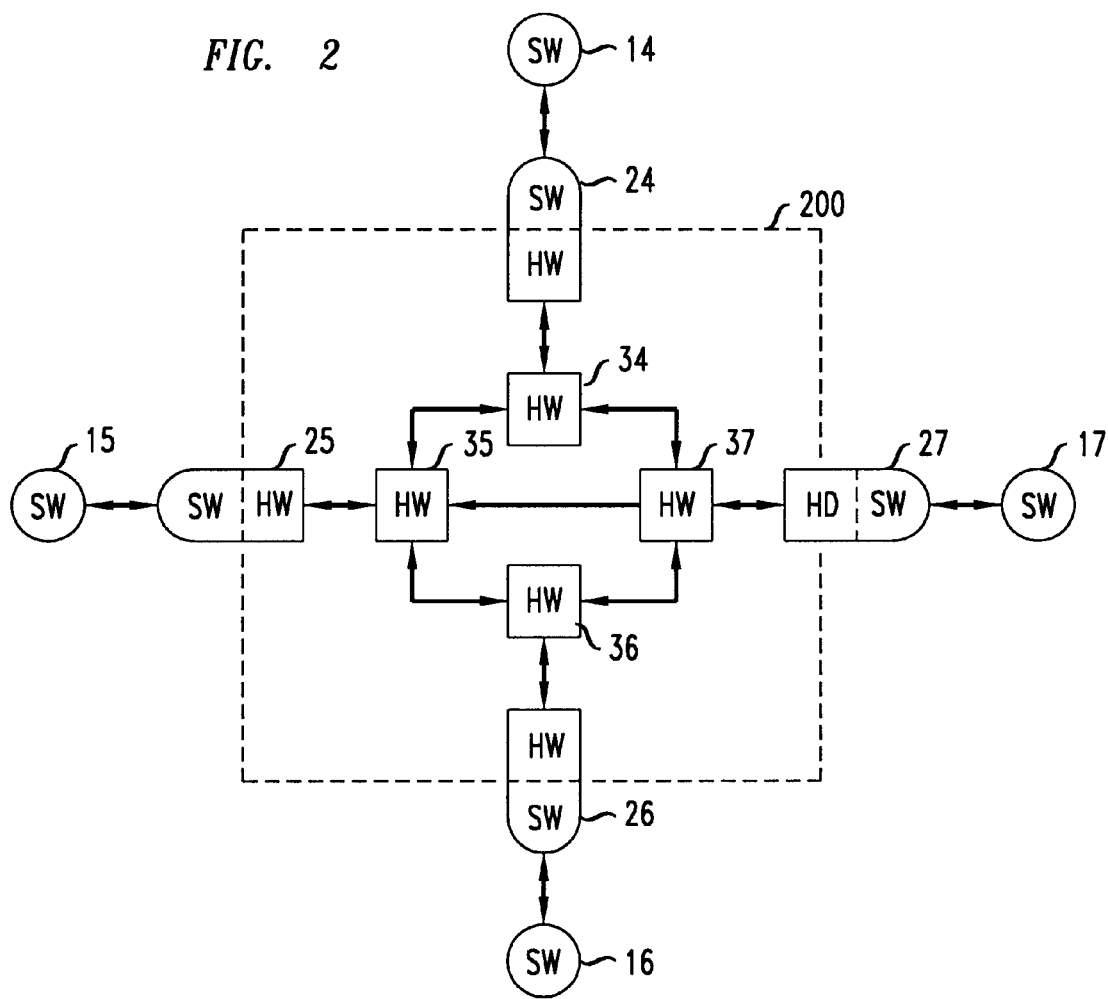
FIG. 2 presents a hardware-centric view of a system having both software and hardware parts.

FIG. 2 depicts a hardware-centric view of a system. In this view, hardware components and subsystems are interconnected to each other, and each of the components or systems also communicates with software modules. This communication is carried out through hardware/software interfaces. Thus, in FIG. 2, hardware subsystem 34 communicates with software process 14 through interface element 24, hardware subsystem 35 communicates with software process 15 through interface element 25, hardware subsystem 36 communicates with software process 16 through interface element 26, and hardware subsystem 37 communicates with software process 17 through interface element 27. Each process, expressed as an SDL system, has only one interface process. Unlike the dual software-centric view, in the hardware-centric view, only hardware modules which are part of the same subsystem are considered at any one time. In other words, in arrangements that comprise two or more different hardware systems that are coupled to each other only indirectly, through the software, the verification problem is treated as comprising two or more independent verification problems. Thus, within dashed box 200 of FIG. 2, all the modules coordinate synchronously. If there are other hardware components in the greater system, they must be treated in a separate hardware-centric model. The interface processes together with the pure SDL systems form an environment for the hardware part and establish constraints on the primary inputs of the hardware.

It should be realized that a complete system cannot always be neatly depicted as hardware-centric or software-centric. Therefore, in accordance with one of the principles disclosed herein, a system to be verified is treated separately for each of the set of properties that characterize the system. The thesis is that when a system properly verifies for all of its desired properties, it will operate as intended.

Figure 3:
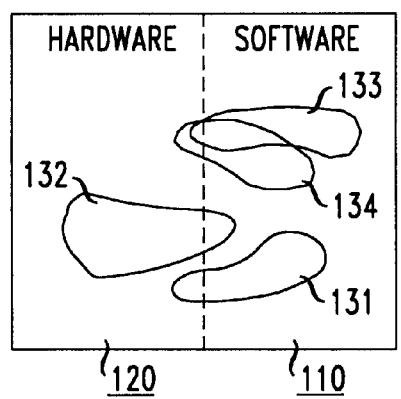
FIG. 3 illustrates that certain properties of a system having both software and hardware components involve mostly hardware or mostly software.

FIG. 3 illustrates a system 100 that has software and hardware elements that interact in, perhaps, a very complex way. Still, one can consider that the system comprises a software part 110, and a hardware part 120. As indicated above, it may be determined that for a particular property to be verified, some portions of the system are irrelevant. This is illustrated in FIG. 3 by the areas inside, and outside, closed curve 131. The area inside closed curve 131 encompassed the system elements that are involved in the particular property of interest, while the area outside closed curve 131 corresponds to system elements that do not participate in and, therefore, need not be considered in the process of verifying the particular property. It may be noted that the particular property of interest identified by closed curve 131 involves mostly software elements, i.e., processes, of the system and only a few hardware elements, i.e., components or subsystems, of the system. Hence, advantageously, this particular property may best be considered to be software-centric. Another property of the FIG. 3 system that illustratively needs to be tested is encompassed by the system elements within closed curve 132, and that property involves mostly hardware elements. Hence, this property may best be considered to be hardware-centric.

To illustrate other possibilities, closed curves 133 and 134 show two software-centric properties that have some software processes in common. They also share some of the hardware interfaces.

To summarize, in accordance with the present disclosure, a system's verification is defined by a collection of properties to be verified. Each property comprises coordinating software processes expressed in a software-centric language, and interacting hardware components expressed in a hardware-centric language. Each property is verified individually. The verification of each property encompasses only the system elements that participate in the actions of the tested property, and this reduces the verification complexity (i.e. reduces the computational burden).

Figure 4:
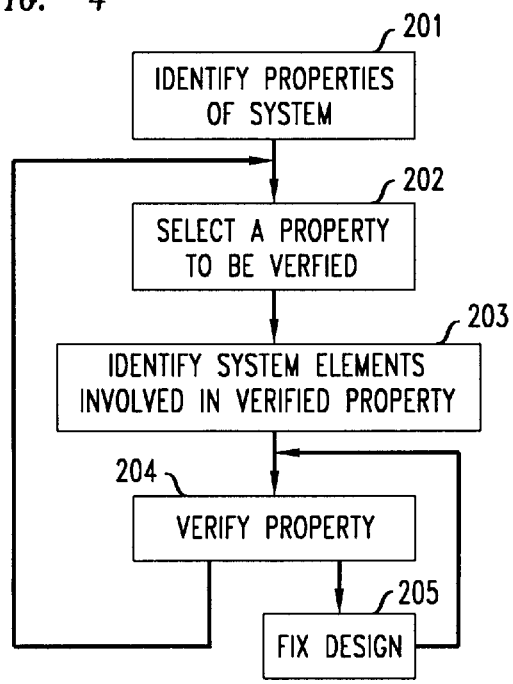
FIG. 4 presents a flowchart of a design verification process for a system having both software and hardware parts.

This is illustrated in the flowchart of FIG. 4, where the system's properties to be verified are identified in block 201, a property to be verified is selected in block 202, and the system elements that are involved in the property are identified in block 203. The process continues to block 204, where the property is verified and, if the verification is affirmative, control returns to block 202 to verify another property. Otherwise, control passes to block 205 where either the design or some of the assumptions employed in block 203 are modified, returning control to block 204 for another verification attempt.

Amplifying on the operation of block 204, properties are identified as softwarecentric or hardware-centric. Illustratively, this is done by the user, who makes the identification and specifies the property to be software-centric or hardware-centric. However, regardless of whether a property is software-centric or hardware-centric, the expectation that a property had both a software part and a hardware part presents two challenges. One is that we wish to employ symbolic verification of the design, and another is that verifying software presents a substantial computational problem.

These challenges are addressed by employing a modified, static, partial order reduction algorithm to reduce the graph represented by the software, to compile the software into a synchronous model, to combine the representations of the hardware parts and the software parts into a common-language representation, and to apply the combined representation to a symbolic verification tool.

While performing the static partial order reduction on the software portion of a property, it is helpful to make certain assumptions about the system's behavior at the interface between the software and the hardware portions, because such assumptions reduce the computational complexity and volume of the necessary computations. For example, assuming that a particular input to a software module is frozen in some chosen state may make a substantial portion of the code contained the module irrelevant. Making these assumptions is tantamount to breaking a connection in the system at some point where hardware supplies a signal to software, and supplying an external signal instead. Of course, this may result in some behavior by the software that affects the hardware and, in particular, affects the hardware portion that normally creates the signal applied to the particular input. Part of the verification process, therefore, calls for a verification that the hardware will produce the chosen state at the particular input. If this verification fails, the user is faced with two options: modify the design so that it will verify for the assumed input conditions, or assess whether a weaker assumption about the inputs would be acceptable. If the later is chosen, then the weaker assumption is made and the verification is repeated. Thus, a few iterations of verification may be necessary before the co-design stabilizes.

Unlike conventional embodiments of the partial order reduction technique, which implement the reduction dynamically in the course of the state reachability, what is needed in the modified realization is an algorithm that would be compatible with the synchronous nature of the companion hardware parts, and one that would be able to apply the reachability analysis symbolically. These needs call for a way to implement the partial order reduction statically (during compile time) in a fashion that would be compatible with a symbolic search.

Starting with the idea that a partial order reduction can be viewed as a constraint on the transition relation of the unreduced system, it was discovered that such a constraint could be represented synchronously as an automaton, compatible with COSPAN's underlying automata-theoretic basis. Furthermore, COSPAN efficiently implements safety constraints in a fashion that prevents the exploration of unaccepted traces. Moreover, although it was first envisioned that COSPAN's core algorithms would need to be augmented in order to implement the cycle-closing condition discussed above, it clearly is of great advantage that a way to avoid this was discovered. Instead, the cycle-closing condition is implemented into the statically defined constraint automaton as well.

To make the SDL specification compatible with the synchronous nature of the companion hardware parts the SDL specification resulting from the partial order reduction is transformed to an equivalent synchronous specification. This is accomplished using non-determinism to simulate asynchrony, as described by R. P. Kurshan, M. Merritt, A. Orda, and S. Sachs in "Modeling Asynchrony with a Synchronous Model," *Conference on Computer Aided Verification* (CAV 95), LNCS 939, Springer-Verlag, (1995) pp. 339–352, which is hereby incorporated by reference. The static partial reduction and the conversion to synchronous form are incorporated into an SDL compiler which, as mentioned earlier, may be licensed from Lucent Technologies.

Hardware-centric verification is used to check properties relating mainly to the hardware side of the co-design. In connection with such properties, the software modules in the hardware-centric view of the system shown in FIG. 2 correspond to distinct SDL systems which can coordinate only through the hardware. Just as with the software-centric system, partial order reduction followed by localization reduction may be applied. However, if little of the software side gets entailed in the hardware-centric verification, localization reduction may suffice, and be faster than running the partial order reduction algorithm followed by the localization reduction algorithm.

Figure 5:
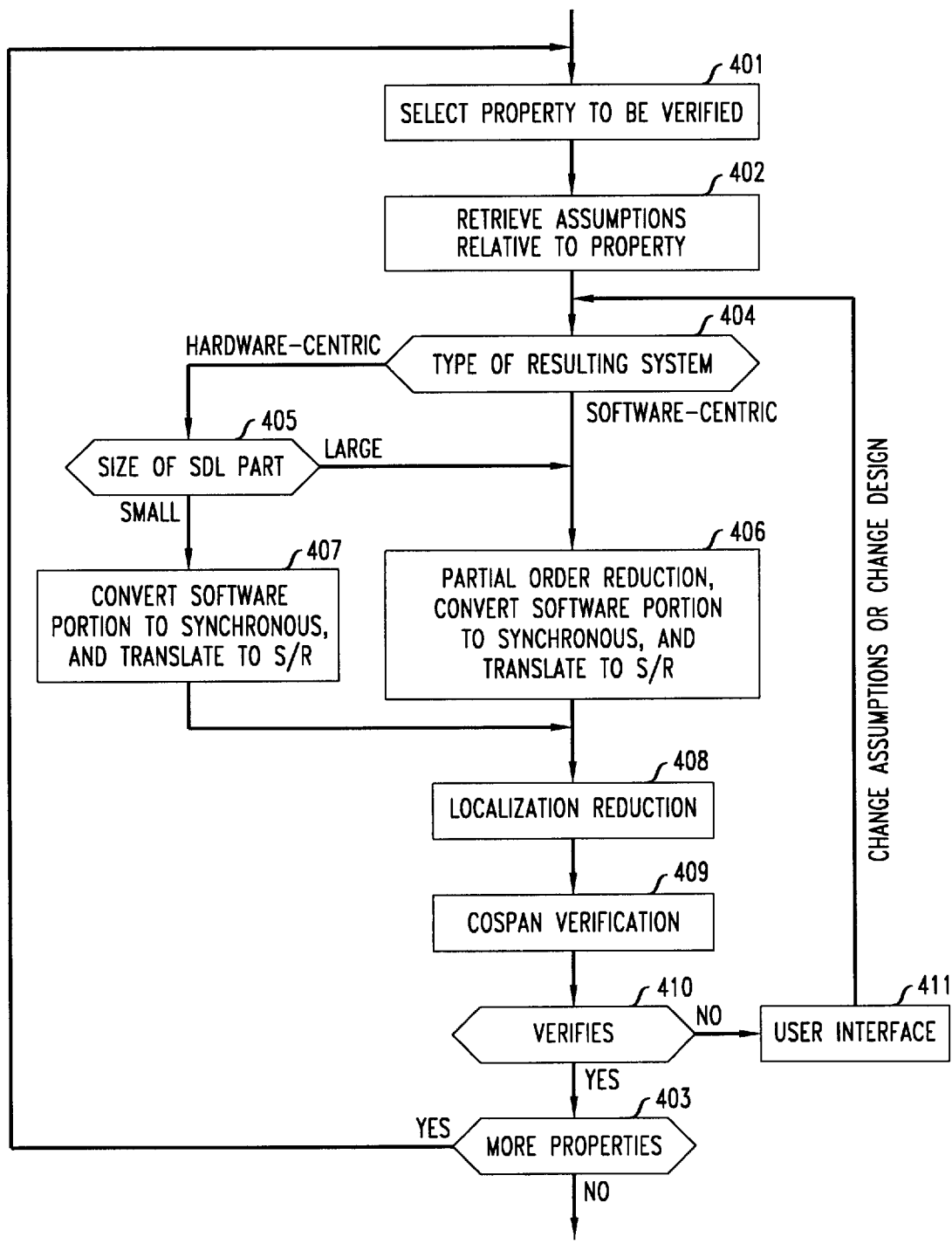
FIG. 5 is a more detailed flow diagram of a verification process for a system having both software and hardware parts.

FIG. 5 presents a flow chart that amplifies on the flow chart of FIG. 4. Prior to execution of block 401, a specification is obtained for the software part of the system to be verified, for example, in SDL language; a hardware specification is obtained for the hardware part of the system to be verified, for example in VHDL language; a set of properties to be verified is obtained with their characterization as hardware-centric or software-centric; and assumptions about the system's behavior are provided which form initial constraints of the system. The system elements that participate in each of the properties are included as part of these specifications. Block 401 selects a property to be verified, identifies the system components that participate in the property, and passes control to block 402 which retrieves the assumptions about the system's behavior that are relevant to the property to be verified. Control then passes to decision block 404 which determines whether the property to be tested is hardware-centric or software-centric. Based on the decision of block 404, control passes to either block 405 or block 406. If the property to be verified is hardware-centric, block 405 determines whether the software part of this property is large enough to merit performing partial order reduction. When such is the case, control passes to block 406. Otherwise, control passes to block 407. Block 406 employs the constraints relevant to the tested property, performs the static partial order reduction, converts the resulting state-space graph to synchronous form and compiles it, together with the hardware portion, into some selected language that is compatible with synchronous systems. Illustratively, this can be S/R, which is the native language of the verification tool COSPAN. Block 407 does the same, except that it does not performs partial order reduction on the software portion. The results of blocks 406 and 407 are applied to block 408 which performs localization reduction also employing the constraints relevant to the tested property, and then to block 409 which performs the verification. The verification result is applied to decision block 410 which determines whether the verification was successful, or not. When the verification is not successful, information is provided to the user who is in control of the verification process (block 411). The user decides whether to attempt another verification. In such a case, the user changes either the assumptions (generally weakens them) or changes the design, and returns control to block 404. When a property verifies, control passes to block 403 which assesses whether properties remain that need to be verified, and if so, control returns to block 401. Otherwise, the process terminates.

Figure 6:
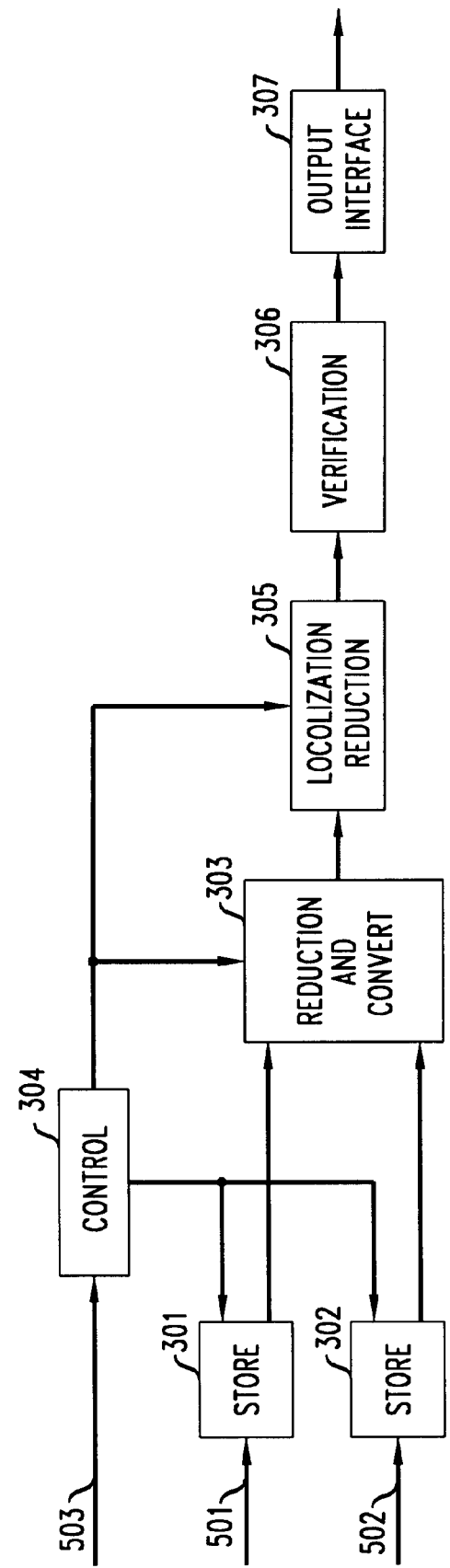
FIG. 6 is a functional diagram of apparatus that performs design verification for a system having both software and hardware parts.

FIG. 6 illustrates a functional diagram of a hardware arrangement for verifying software/hardware designs. Line 501 provides a specification of the hardware portion of the system to be verified, in a hardware-centric language such as VHDL, which is stored in element 301. Line 502 provides a specification of the software portion of the system to be verified, in a software-centric language such as SDL, and that is stored in element 302. Controller 304 is responsive to user inputs on line 503, and some of those inputs are assumptions about, or constraints on, the behavior of the system to be verified, relative to various properties of the system. Selecting a particular property to be verified, controller 304 retrieves the relevant SDL specification from element 302, the relevant VHDL specification from element 301, and the constraints, and applies them to element 303. Element 303 performs the functions of blocks 406 and 407 described above, and sends the resulting specification to element 305 which performs localization reduction and provides its output to element 306, the latter being the formal verification tool. When the verification tool is COSPAN, element 303 preferably produces an output in S/R, and elements 305 and 306 are combined (because COSPAN includes localization reduction).

Element 306 performs a verification of the submitted specification and provides an output that either confirms that the design is verified, or indicates a failure and identifies situations, or conditions where a property fails and therefore cannot be verified as operating correctly. This output is advantageously provided in a standardized format, such as VCD, and is applied to a post-verification user-presentation tool 307. Illustratively, tool 307 is an ODAN module that is available from Lucent Technologies.

Of course, a skilled artisan would realize that the functions performed by the various processing elements of FIG. 6 can be implemented in a suitable single processor with attendant memory and control elements.

Static Partial Order Reduction

There is extensive literature on partial order reduction techniques. See, for example, P. Godefroid, and P. Wolper, "A Partial Approach to Model Checking," 6th *Annual IEEE Symposium on Logic in Computer Science*, 1991, Amsterdam, pp. 408–415; D. Peled, "Combining Partial Order Reductions With On-the-fly Model-Checking," *Formal Methods in System Design U* (1996), pp. 39–64; and A. Valmaui, "Stubborn sets for reduced state space generation," 10*th International Conference on Application and Theory of Petri Nets*, Bonn, Germany, LNCS 483, Springer-Verlag, (1989) pp. 491–515. Partial order reduction, in general, exploits the observation that in models of coordination with the semantics of interleaved events, concurrent events are modeled by executing the events in all possible orders. The reduction exploits the fact that properties for such systems cannot distinguish among the different orders, producing a representation of the checked system which contains only a subset of the states and transitions of the original system. This representation is a quotient of the unreduced model, being equivalent to the unreduced model with respect to the property. The subset of the behaviors in the quotient, which are the paths in a reduced state graph, need only preserve the checked property. Namely, when the model-checking algorithm is applied to the reduced state graph, it would result in a positive answer when the property holds, and a counter example when it does not hold.

The approach presented by Peled in the aforementioned publication, for example, employs the ample sets method. In this method, for each state a of the modeled system, there is a set of (atomic) transitions that can be executed next, or are enabled. These will be denoted by enabled(s). The simple model-checking algorithm constructs the state graph of the program under test by performing a search, typically, a depth or breadth-first search. The search starts with an initial state and progresses to explore its immediate successors, generated by applying the enabled transitions, then their successors, and so on. Different search strategies vary from each other by the order in which the successors are searched.

From a given state s, the partial order reduction explores only a subset of the enabled transitions: the set ample(s). Such an ample set is chosen to enforce some conditions that guarantee the preservation of the checked property in the resulting quotient.

It is assumed that every state is labeled by some subset of the atomic propositions that appear in the formulation of the checked property, and L(s) denotes the set of propositions that hold in s.

Before presenting the conditions we use for choosing ample(s), two more concepts are defined. The first concept is that a pair of transitions is said to be independent, if executing one and then the other starting at any state s results in the same subsequent state s', regardless of the order of execution. Moreover, if a first one of them is enabled, then after executing the second, the first one remains enabled. The second concept is that of invisible transitions. A transition is invisible if, when executed, it does not change the state labeling. That is, for each pair of states s and s', if an invisible transition is executed from s results in s', the labels remain the same; i.e., L(s)=L(s').

Now sufficient conditions can be given on the sets ample (s) for-the resulting partial order reduction to preserve a given property. The explanation of these conditions and a proof that they guarantee a reduced state graph that preserves the given property appears in the aforementioned Peled publication.

A state s is said to be fully expanded when ample(s)= enabled(s), i.e., all the transitions are selected.

C0 [Non-emptiness condition] Ample(s) is empty if and only if enabled(s) is empty.

C1 [Ample decomposition ] For every behavior of the system, starting from the state s, a transition that is dependent on some transition in ample(s) never appears (in the unreduced model) before a transition from ample(s).

C2 [Non-visibility condition] If s is not fully expanded, then none of the transitions in it is visible.

C3 [Cycle closing condition] At least one state along each cycle of the reduced state graph is fully expanded.

The first model-checking system to implement these conditions was SPIN, described by G. J. Holzmann, and D. Peled, in "An Improvement in Formal Verification," 7*th International Conference on Formal Description Techniques*, Berne, Switzerland, 1994, pp. 177–194. In order to guarantee these conditions, the search mechanism of SPIN was changed and specialized for the reduction. Conditions C0 and C2 are trivial to check. C0 is a local syntactic check and C2 is guaranteed through scoping rules imposed syntactically on the design. Condition C1 is translatable into a set of checks on the transitions enabled at the current state s. For example, if some process can execute from its current program counter only local transitions that do not involve global variables or exchanging messages, then its set of transitions are guaranteed to satisfy condition C1. Condition C3 is handled by checking whether a selected ample set closed a cycle (in depth-first search this happens when a state that is already on the search stack is reached). If so, the currently selected ample set is discarded in favor of an alternative selection.

In creating a compiler that translates from SDL to S/R, it is desirable to use partial order reduction but, as already discussed, several goals dictate a solution that is different from the one used in SPIN. Most particularly, in order to be able to use a symbolic state space search, it was desired to use a reduction algorithm which was not dependent on the use of depth-first search.

The reduction described next has the added benefit that it can be used with any model-checking algorithm for synchronous models, without any modification of the model-checking algorithm whatsoever. Moreover, this new partial order reduction algorithm is very general, being insensitive to the mode of state space search employed.

The main obstacle to implementing the reduction in the context of a breadth-first search is that one needs to avoid the possibility of a cycle where no state is fully expanded. At first blush, condition C3 suggests that a substantial change to the model-checking algorithm would be required to achieve this in the context of a breadth-first search. In fact, we discovered that this may be accomplished very simply and generally, without modification to the model-checking algorithm.

In principle, the algorithm should be capable of producing at least as good a reduction (measured in terms of reached states) as the ones described by Holtzmann and Peled in the aforementioned article, or Alur et al. in the aforementioned LNCS 1254 publication, although with symbolic analysis, the number of reached states is a poor complexity measure. Moreover, there are tradeoffs between the size of the reduction and the cost of producing the reduction, which are also hard to compare across algorithms, in general.

In accordance with the improved partial order reduction algorithm, the C3 condition is replaced by C3' There is a set of transitions T such that each cycle in the reduced state space includes at least one transition from T. If ample(s) includes a transition from T, then s is fully expanded.

The set of transitions T may be called sticky transitions since, in a sense, they stick to all other enabled transitions.

An easy way to find such a set T is to look at the static control flow graph of each process of the checked system. Any cycle in the global state space projects to a cycle (or possibly a self-loop) in each component process. By breaking each local cycle, each global cycle is guaranteed to be broken. This suggests the following further strengthening, which guarantees the above condition C3'; namely:

C3" Each cycle in the static control flow of a process of the modeled system contains at least one sticky transition, and if ample(s) includes a sticky transition, then s is fully expanded.

Condition C3" can be satisfied by using a static analysis algorithm on the (small) component processes, to find a set of sticky transitions T, lifted to the global state space from each respective component process. While finding a minimal sticky set is NP hard, (it is the same as removing transitions—the sticky ones—until there are no cycles left in the static control flow graph), it is NP hard in the size of the local control flow graph (i.e., each process) which is small, not the much bigger global state graph. Moreover, one need not find a minimal T. One way to find a set of sticky transitions in a local control graph is to choose all the back-edges in the course of a depth-first search, i.e., an edge from the currently searched state to a state currently in the search stack. The resulting T is the lifting of each local back-edge. Since the local control graphs are small, they can be searched at compile time, at no perceptible cost. (Any syntactic transition is assumed to be an edge in the local control graph. While this heuristic could be foiled by a process with many unsatisfiable transitions, this is not commonly the case, and a process is envisioned as not only small, but as having a sparse set of transitions).

It should be noted that priority is given to transitions that are not sticky. Sticky transitions may be deferred, although no cycle can be closed without having passed through at least one sticky transition. It is possible that a global cycle may include more than one fully expanded state, due to sticky transitions lifted from different processes. However, since sticky transitions have low priority, and the reduction algorithm tries to select the other transitions first, it may be worthwhile to defer several of them to a point where they all can be taken from the same state. This is possible because the expansion for sticky transitions may occur anywhere along a cycle.

In practice, one may weaken condition C3" as follows. A cycle in the reduced state graph cannot consist of only receiving messages, since all message queues would then become eventually empty, and some sending messages (a "send" event) would be required to close the cycle. Thus, local control flow cycles with only message receives do not have to include a sticky transition; it must be part of another cycle projected from a cycle in the global state graph. (While that this is true also for sending messages—the queues will eventually get filled—if the same relaxation is allowed at the same time to both sending and receiving messages, they can cancel the effect of one another and be part of a global state graph cycle.) This observation can be used to design an algorithm that is linear in the size of the control graphs of each process. After removing the receiving transition from the control graph of a process, a linear time search can be performed on the remaining transitions to identify any back-edges and mark them as the sticky transitions.

There are many ways to further relax condition C3". One is to involve the user to some extent in further marking sticky transitions. This would reduce the more arbitrary assignment which would result from choosing all back-edges, as disclosed above. Another way is to perform the back-edge analysis after combining a few processes—only the cycles of the larger structure need be broken.

To achieve a partial order reduction that is independent of the search control in COSPAN, the selection mechanism of S/R is exploited. This mechanism consists of using selection variables. These variables are combinatorial, not part of the state, and thus do not incur any memory overhead. When deciding on the successor state, each process chooses non-deterministically among some possible values of its selection variables. The choice of any process can be dependent on the choice of the selections of the other processes (as long as this relationship is a-cyclic). In particular, the size of ample(s) can be heuristically optimized by selecting the process with ample(s) sets as small as possible, i.e., with the fewest number of enabled transitions.

At each local state of a process, it is determined whether the currently enabled transitions satisfy condition C1. If so, it is concluded that the process is ample at this state. One way to determine this is as follows. A process is considered to be ample at a state if it does not have an enabled sticky transition and all its enabled transitions either are receiving or internal transitions. If the process has only internal transitions (the transitions in which only the local variables are referred), then it is clear that the enabled transitions of the process satisfy C1 since no other process can refer to those variables. Similarly, when the process has only receiving transitions, the enabled transitions of the process again satisfies C1. Although the send transition of another process can change the same message queue from which the receiving transition reads, their execution orders do not matter. The problem is that several processes may have enabled transitions that are potentially ample sets. Selecting all of these sets would be counter to the goal of minimizing the selected transitions. Actually, the selection mechanism can be used to resolve this. When a process is ample, it can use global selection variables to inform the other processes about this fact. If several processes are ample at the same time, they choose one of them through a static (index number) priority. The other ample processes are informed via the selection variables that they are not the chosen candidate for providing an ample set, and do not contribute transitions to this set.

It should be understood that the above disclosed the principles of this invention and that various modifications and alternations can be incorporated in different embodiments without departing from the spirit and scope of this invention, which is defined in the following claims.

We claim:

1. A method for verifying design of a system having both software and hardware parts comprising the steps of:
    accepting an input of a first specification of the software part in a software-centric language;
    performing a partial order reduction to reduce the size of said first specifications deriving a reduced first specification;
    converting said reduced first specification to synchronous form to form a converted first specification;
    accepting an input of a second specification of the hardware part in a hardware-centric language;
    verifying design represented by said second specification and said converted first specification; and
    presenting results of said step of verifying.

2. The method of claim 1 where said step of verifying includes the steps of
    translating said converted first specification to a specification language of a verification tool if said verification tool is unable to operate on inputs presented in said software-centric language; and
    translating said second specification to a specification language of said verification tool if said verification tool is unable to operate on inputs presented in said hardware-centric language.

3. The method of claim 2 where said verification tool is COSPAN, and said step of translating said first specification translates said first specification into S/R specification language.

4. The method of claim 2 where said verification tool is COSPAN, and said step of translating said second specification translates said second specification into S/R specification language.

5. The method of claim 1 where said partial order reduction is a static partial order reduction.

6. The method of claim 1 where said step of presenting results comprises presenting a confirmatory output indicating that the design will operate as expected, or presenting a counter example that demonstrates a failure of the system to operate as expected under a particular set of circumstances.

7. The method of claim 1 where said first specification is in SDL specification language.

8. The method of claim 1 where said second specification is in VHDL or Verilog specification language.

9. The method of claim 1 where said step of verifying comprises verifying a set of properties that characterize said system.

10. A method for verifying design of a system having both software and hardware parts comprising the steps of:
    accepting into storage an input of a specification of the software part in a software-centric language, a specification of the hardware part in a hardware-centric language, a specification of properties that the system is to possess, and an initial set of constraints;
    selecting a property to be verified,
    verifying the selected property,
    when the step of verifying fails, displaying said failing and offering an opportunity to provide modifications to said constraints and/or specifications,
    accepting said modifications,
    returning to said step of verifying, and
    selecting another property to be verified when said step of verifying succeeds.

11. The method of claim 10 where said specification of the software part and said specification of the hardware part in a hardware-centric language comprises a collection of specifications, each of which represents a specification of those elements of said system that relate to a particular one of said properties.

12. The method of claim 10 where said step of verifying comprises:
    retrieving from said storage hardware specification and software specification portions that pertain to said selected property;
    converting said retrieved software specification portion to synchronous form;
    translating said converted specification to a specification language of a verification tool if said verification tool is unable to operate on inputs presented in said software-centric language; and
    translating said retrieved hardware specification portion to a specification language of said verification tool if said verification tool is unable to operate on inputs presented in said hardware-centric language.

13. The method of claim 12 where said step of verifying further comprises a step of localization reduction.

14. The method of claim 12 where said step of verifying further comprises a step of retrieving from said storage constraints that are relevant to said selected property, and a step of localization reduction responsive to said retrieved constraints.

15. The method of claim 10 where said step of verifying further comprises the steps of:
    retrieving from said storage hardware specification and software specification portions that pertain to said selected property;
    ascertaining whether said selected property is hardware-centric or software-centric;
    applying partial order reduction to the retrieved software specification portion when said selected property is software-centric;
    applying said partial order reduction to the retrieved software specification portion when said selected property is hardware-centric but said retrieved software specification portion meets a preselected condition converting to synchronous form said retrieved specification of the software part, when said selected property is hardware-centric and said retrieved software specification portion fails to meet said preselected condition, and converting to synchronous form results of said partial order reduction, when said selected property is software-centric or is hardware-centric and said retrieved software specification portion does meet said preselected condition;

translating said converted specification to a specification language of a verification tool if said verification tool is unable to operate on inputs presented in said software-centric language; and translating said specification of the retrieved hardware part to a specification language of said verification tool if said verification tool is unable to operate on inputs presented in said hardware-centric language.

16. The method of claim 15 where said ascertaining whether a property is hardware-centric is made based on information found in said storage.

17. The method of claim 15 where said partial order reduction is a static partial order reduction.

18. The method of claim 15 where said step of retrieving also retrieves constraints that are relevant to said selected property, and said step of applying partial order reduction employs the retrieved constraints.

19. The method of claim 15 where said step of verifying further comprises a step of localization reduction.

20. The method of claim 19 where said step of verifying further comprises a step of retrieving from said storage constraints that are relevant to said selected property, and a step of localization reduction responsive to said retrieved constraints.

21. A method for verifying design of a system that includes software comprising the steps of:

performing static partial order reduction on a specification of said system;

converting results of said static partial order reduction to synchronous form;

verifying design represented by results of said step of converting; and presenting visual results of said step of verifying.

22. The method of claim 21 where said step of verifying performs localization reduction followed by symbolic verification.

23. The method of claim 22 where said symbolic verification employs state reachability analysis.

24. The method of claim 22 where said symbolic verification employs symbolic state-space search.

25. Apparatus for verifying a design comprising:

a memory for storing a specification of said design, a collection of properties, and constraints;

a controller;

a first processor responsive to those portions in said specification, obtained from said memory, that describe software, for performing static partial order reduction analysis under control of said controller;

a second processor, responsive to control signals from said controller, for converting to synchronous form those portions in said specification that describe software or for converting to synchronous form output signals of said first processor;

a verification tool responsive to those portions in said specification, obtained from said memory, that describe hardware, and to output signals of said second processor; and a display responsive to said verification tool.

26. Apparatus for verifying a design comprising:

a memory for storing a specification of said design, a collection of properties, and constraints;

a stored program processor responsive to signals stored in said memory for performing static partial order reduction on said design followed by symbolic verification; and a display responsive to signals provided by said processor indicative of whether said design verifies.

27. Apparatus for verifying a design comprising:

a memory for storing a specification of said design, a collection of properties, and constraints;

a controller;

first means responsive to those portions in said specification, obtained from said memory, that describe software, for performing static partial order reduction analysis;

second means for converting to synchronous form those portions in said specification that describe software or for converting to synchronous form output signals of said first processor;

third means responsive to those portions in said specification, obtained from said memory, that describe hardware, and to output signals of said second processor;

fourth means for controlling said first means, said second means, and said third means; and a display responsive to said third means.

* * * * *